(12) United States Patent
Song

(10) Patent No.: US 8,003,451 B2
(45) Date of Patent: Aug. 23, 2011

(54) METHOD OF MANUFACTURING ARRAY SUBSTRATE OF LIQUID CRYSTAL DISPLAY DEVICE

(75) Inventor: Youngjin Song, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 12/127,996

(22) Filed: May 28, 2008

(65) Prior Publication Data
US 2009/0068801 A1    Mar. 12, 2009

(30) Foreign Application Priority Data

Sep. 7, 2007 (CN) .......................... 2007 1 0121529

(51) Int. Cl.
*H01L 21/00* (2006.01)
*H01L 21/84* (2006.01)
(52) U.S. Cl. .............. 438/160; 257/83; 257/59; 349/42; 349/141
(58) Field of Classification Search .................. None
See application file for complete search history.

(56) References Cited

U.S. PATENT DOCUMENTS

| | | | |
|---|---|---|---|
| 2002/0009835 A1* | 1/2002 | Chen et al. | 438/149 |
| 2005/0046762 A1* | 3/2005 | Kim et al. | 349/38 |
| 2005/0110931 A1* | 5/2005 | Yoo et al. | 349/141 |
| 2006/0138417 A1* | 6/2006 | Ahn et al. | 257/59 |
| 2006/0138429 A1* | 6/2006 | Heo | 257/72 |
| 2006/0139504 A1* | 6/2006 | Ahn et al. | 349/42 |
| 2006/0139549 A1* | 6/2006 | Ahn et al. | 349/141 |
| 2007/0153151 A1* | 7/2007 | Yang | 349/43 |
| 2007/0205422 A1* | 9/2007 | Ahn et al. | 257/83 |
| 2008/0014665 A1* | 1/2008 | Kim | 438/30 |

FOREIGN PATENT DOCUMENTS
CN        1782828 A    6/2006
* cited by examiner

*Primary Examiner* — Ha Tran T Nguyen
*Assistant Examiner* — Shantanu C Pathak
(74) *Attorney, Agent, or Firm* — Ladas & Parry, LLP

(57) ABSTRACT

The embodiment of the invention discloses an exemplary method, in which a gate line, a gate electrode, and a pixel electrode are formed in a first step; a multilayer structure is formed on the gate line and the gate electrode in a second step; and a data line and source/drain electrodes are formed in a third step.

16 Claims, 18 Drawing Sheets

METHOD OF MANUFACTURING ARRAY SUBSTRATE OF LIQUID CRYSTAL DISPLAY DEVICE

BACKGROUND OF THE INVENTION

The present invention relates to a manufacturing method of a liquid crystal display (LCD) device, and in particular, to a manufacturing method of an array substrate of a LCD device.

A LCD device comprises an array substrate and a color filter substrate that are disposed opposite to each other. The manufacturing process for an array substrate repeats the processes of thin film deposition, lithography using a mask, etching, photoresist removal, and the like for several times. In lithography, a masking process with a mask plate is necessary, and therefore sometimes the number of lithography processes is referred to as the number of masking processes. The price of consumable materials such as photoresist used in the manufacturing process is high, and also increase of the number of lithography processes leads to addition of the needed equipments. Therefore, an effective method for decreasing product cost and increasing investment return is to reduce the number of manufacturing steps.

The conventional manufacturing technology for an array substrate of a LCD device has progressed from a seven-mask process to a four-mask process. In the currently widely used manufacturing processes for an array substrate, five lithography processes are needed, i.e., five mask plates are needed, which leads to long produce period and may adversely affect yield of product lines.

SUMMARY OF THE INVENTION

An embodiment of the invention provides a method of manufacturing an array substrate of a liquid crystal display (LCD) device, comprising the steps of:

step 1, in which a transparent electrode layer and a gate metal layer are sequentially deposited on a surface of a substrate and are patterned with a first mask plate, so as to form a pixel electrode from the transparent electrode layer and a gate line and a gate electrode branched from the gate line from the gate metal layer;

step 2, in which a gate insulating layer, a semiconductor layer, and a heavily doped semiconductor layer are deposited sequentially on the substrate after step 1 and are patterned with a second mask plate, and the gate insulating layer covers the gate line and the gate electrode, the semiconductor layer and the heavily doped semiconductor layer are remained above the gate electrode, and the gate metal layer is removed on the pixel electrode to expose the pixel electrode; and step 3, in which a data metal layer is deposited on the substrate after step 2 and is patterned with a third mask plate, so as to form source/drain electrodes and a data line, and the semiconductor layer is exposed in an interval region between the source/drain electrodes.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein:

FIG. 2b is a cross-sectional view taken along line A-A1 in FIG. 2a;

FIG. 4b is a cross-sectional view taken along the line of A-A1 in FIG. 4a;

FIG. 8b is a cross-sectional view taken along line A-A1 in FIG. 8a.

FIG. 12b is a cross-sectional view taken along line A-A1 in FIG. 12a;

FIG. 12c is a cross-sectional view taken along a line B-B1 in FIG. 12a;

FIG. 16b is a cross-sectional view taken along line B-B1 in FIG. 16a;

FIG. 19b is a cross-sectional view taken along line A-A1 in FIG. 19a;

FIG. 20b is a cross-sectional view taken along line C-C1 in FIG. 20a; and

DETAILED DESCRIPTION OF THE PREFERRED EMBODIMENTS

First Embodiment

A first embodiment according to the invention provides a manufacturing method, in which a LCD device is manufactured through three steps, i.e., a three-mask process including three masking processes. The steps of this method are described in detail as follows.

[First Step]

Figure 1:
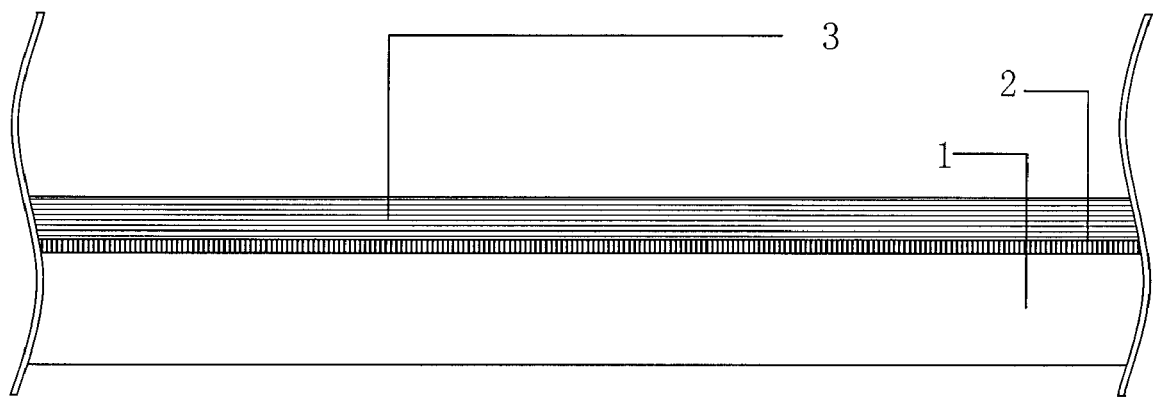
FIG. 1 is a cross-sectional view of a substrate after a deposition process in a first step of a first embodiment of the invention.
Figure 2A:
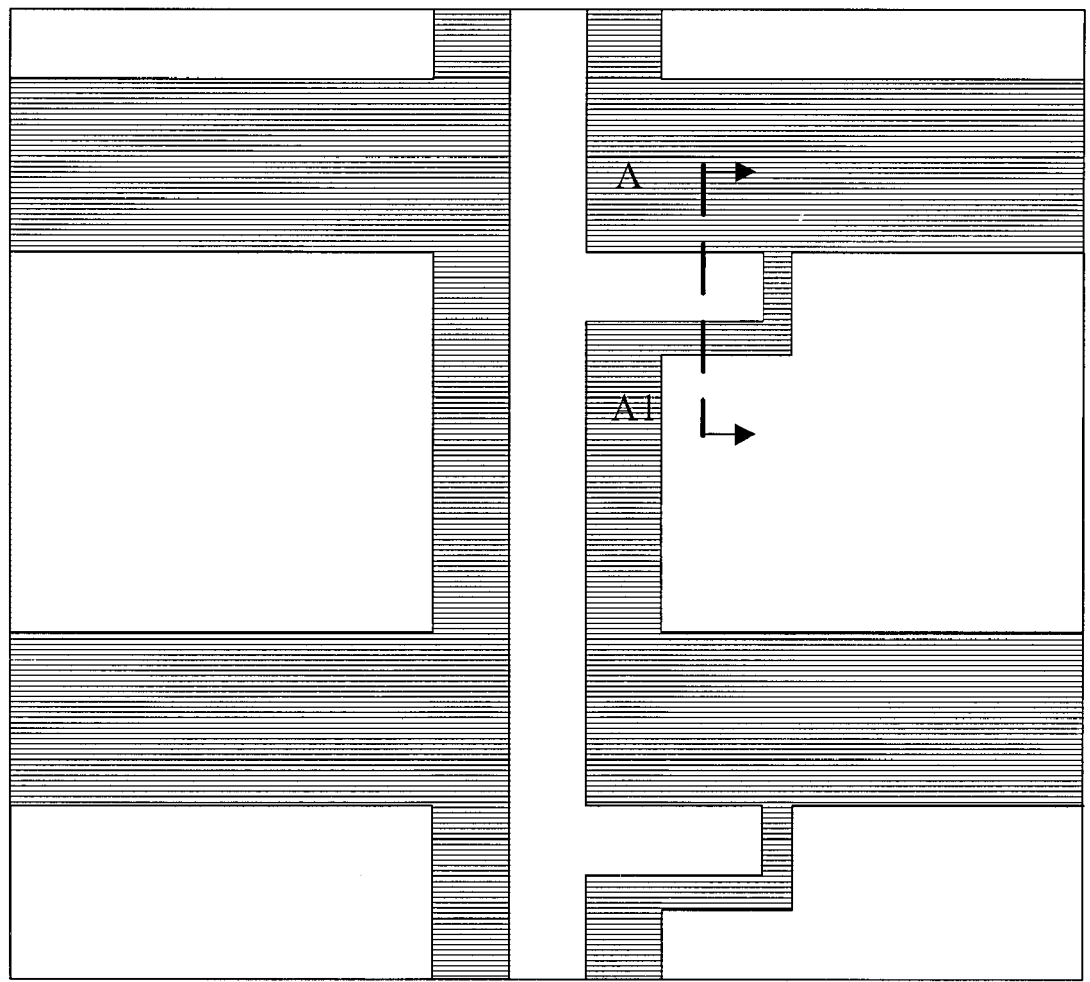
FIG. 2a is a planar view of the substrate after a first masking process in the first step of the first embodiment.
Figure 2B:
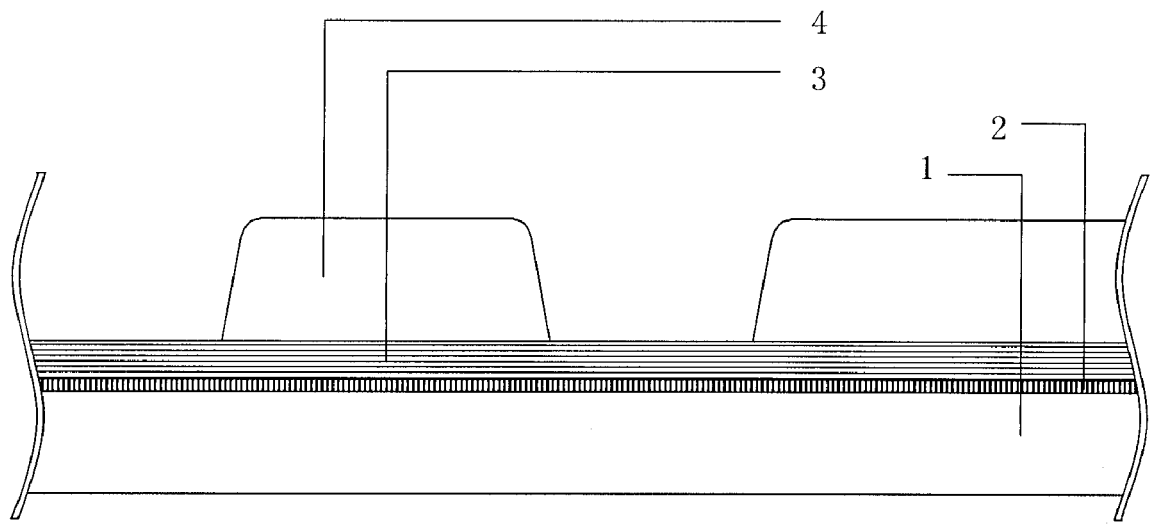

FIG. 1 is a cross-sectional view of a substrate after a thin film deposition process in a first step. As shown in FIG. 1, a transparent electrode layer 2 and a gate metal layer 3 are sequentially deposited on a substrate 1 such as a glass or plastic substrate, and the gate metal layer 3 is on the transparent electrode layer 2. FIG. 2a is a planar view of the substrate 1 after a first masking process in the first step, and FIG. 2b is a cross-sectional view taken along line A-A1 in FIG. 2a. Photoresist is applied on the above resultant substrate, and lithography is performed with a first mask plate on the surface of the substrate 1 formed with the photoresist. After exposure and development, a photoresist pattern 4 is formed (as shown in FIG. 2b) and is then used as an etching mask to form a pixel electrode 21, a gate line 31, and a gate electrode 32 branched from the gate line 31 thereunder, and the remained part of the substrate is exposed, as shown in FIG. 3.

Figure 3:
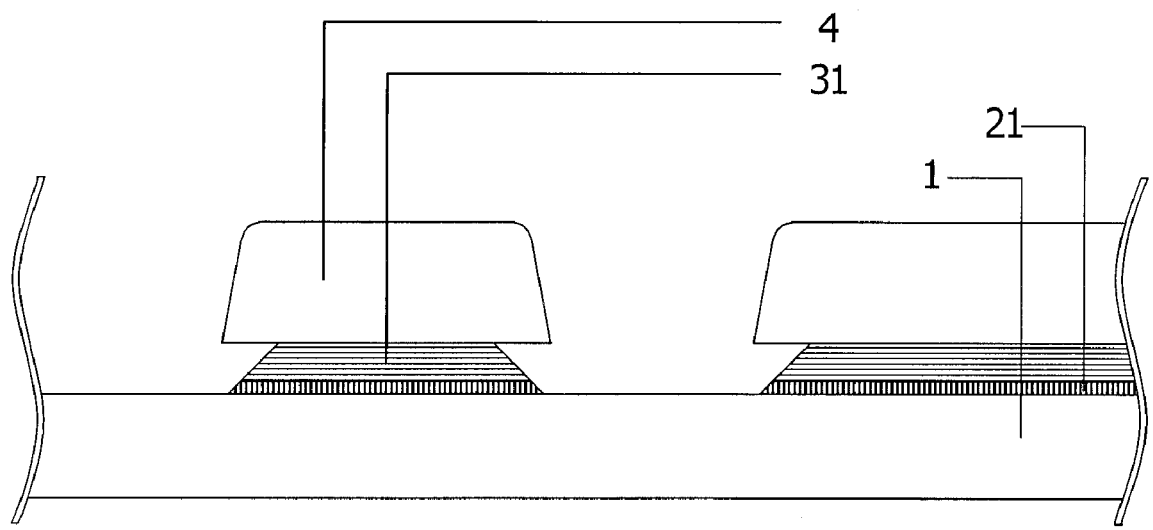
FIG. 3 is a cross-sectional view of the substrate after an etching process in the first step of the first embodiment.
Figure 4A:
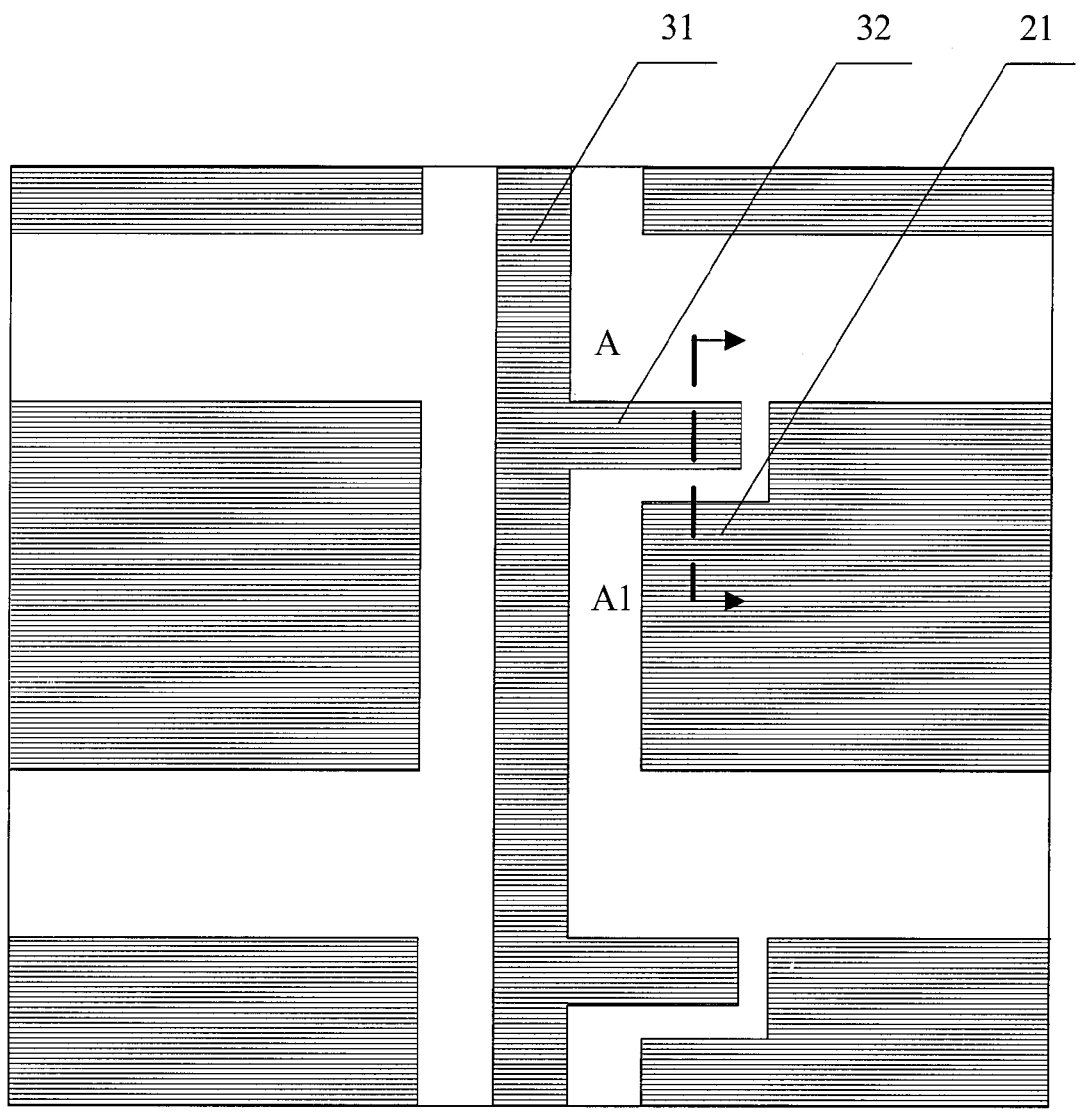
FIG. 4a is a planar view of the substrate after removing the photoresist in the first step of the first embodiment.
Figure 4B:
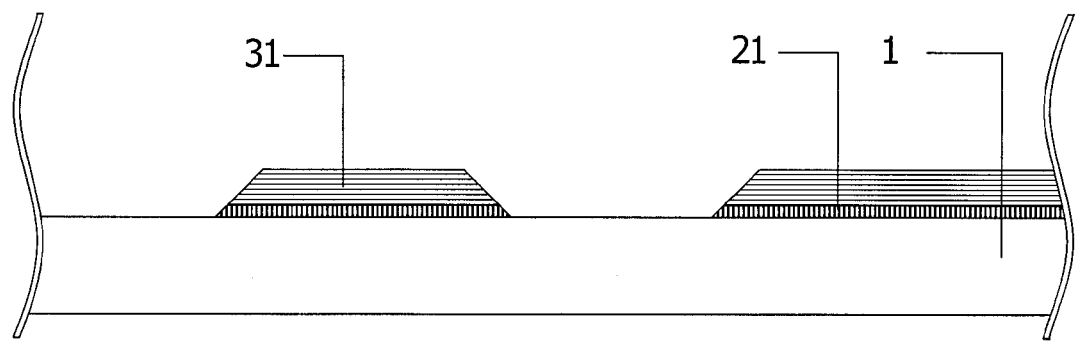

FIG. 3 is a cross-sectional view of the substrate after an etching process in the first step. As shown in FIG. 3, the transparent electrode layer 2 and the gate metal layer 3 not covered with the photoresist pattern 4 is removed in the etching process. FIG. 4a is a planar view of the substrate after removing the photoresist pattern in the first step, and FIG. 4b is a cross-sectional view taken along line A-A1 in FIG. 4a. As shown in FIG. 4a and FIG. 4b, after removing the photoresist pattern 4 by a lifting-off process, the pixel electrode 21, the gate line 31, and the gate electrode 32 branched from the gate line 31 from the transparent electrode layer 2 and the gate metal layer 3 are formed on the surface of the substrate. Thus, the first step is completed here.

[Second Step]

Figure 5:
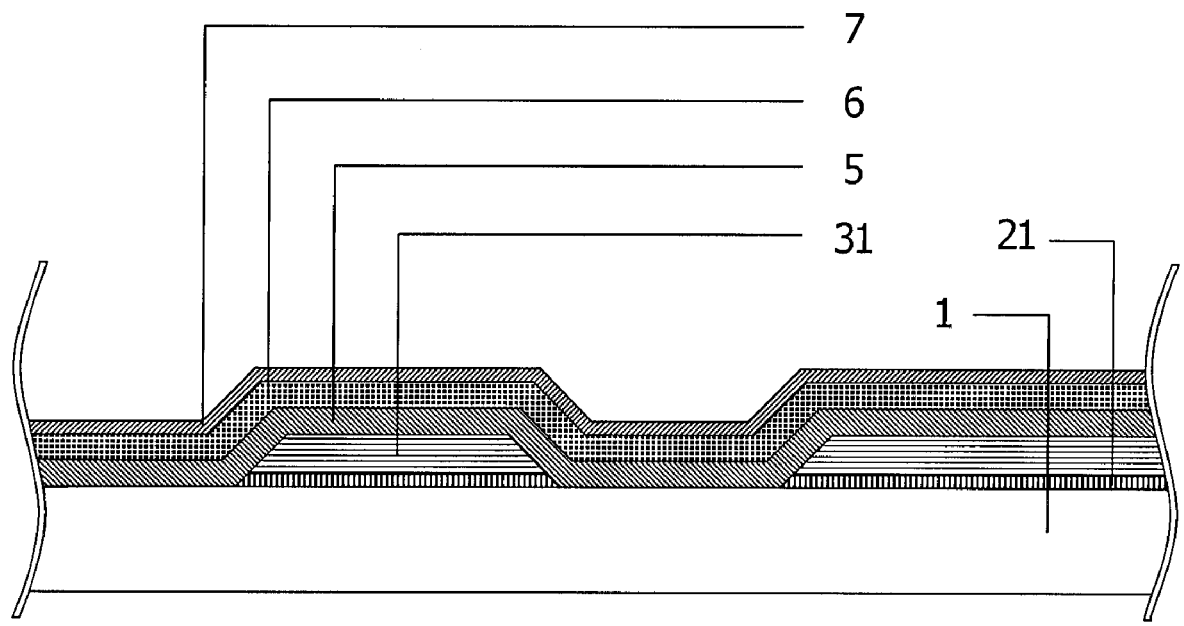
FIG. 5 is a cross-sectional view of the substrate after a deposition process in a second step of the first embodiment.
Figure 6:
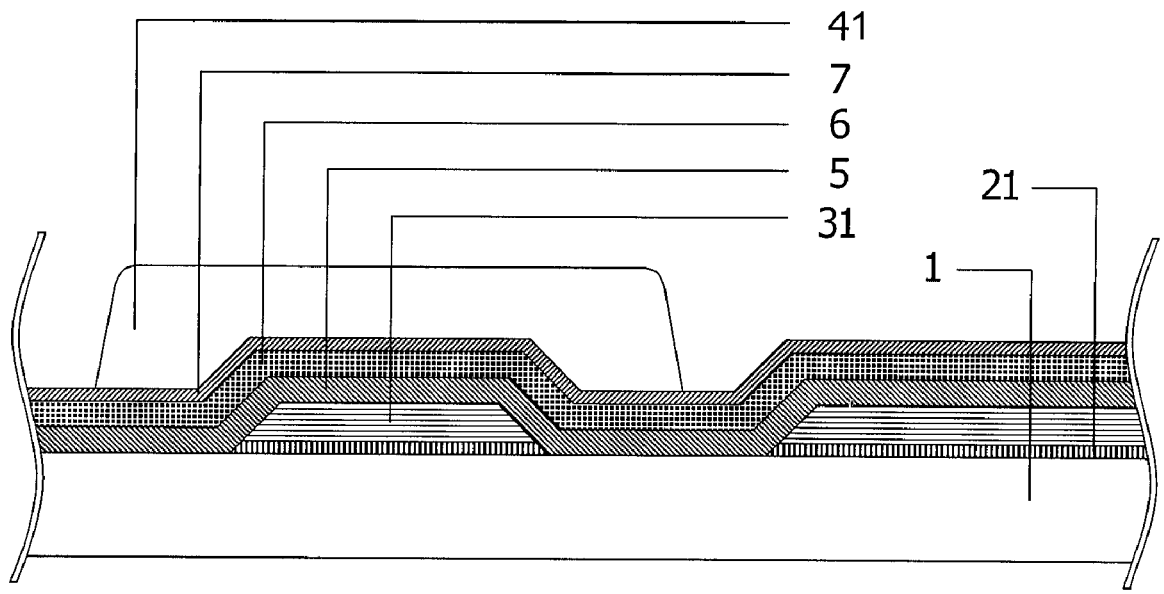
FIG. 6 is a cross-sectional view of the substrate after a first masking process in the second step of the first embodiment.

FIG. 5 is a cross-sectional view of the substrate after a thin film deposition process in a second step. As shown in FIG. 5, a gate insulating layer 5, an amorphous silicon layer 6, and a heavily doped amorphous silicon layer 7 are deposited sequentially on the surface of the substrate after the first step. Here, the amorphous silicon layer 6 and the heavily doped amorphous silicon layer 7 are a semiconductor layer and a doped semiconductor layer of the embodiment and can be replaced by, for example, a polysilicon layer and a doped polysilicon layer, respectively. FIG. 6 is a cross-sectional view of the substrate after a second masking process in the second step. Similar to the first step, photoresist is applied on the surface of the substrate, and lithography and etching processes are performed with a second mask plate. After exposure and development, a corresponding photoresist pattern 41 is formed on the gate line 31 and the gate electrode 32 branched form the gate line 31, and the rest part of the surface of the substrate is exposed at the same time, as shown in FIG. 6.

Figure 7:
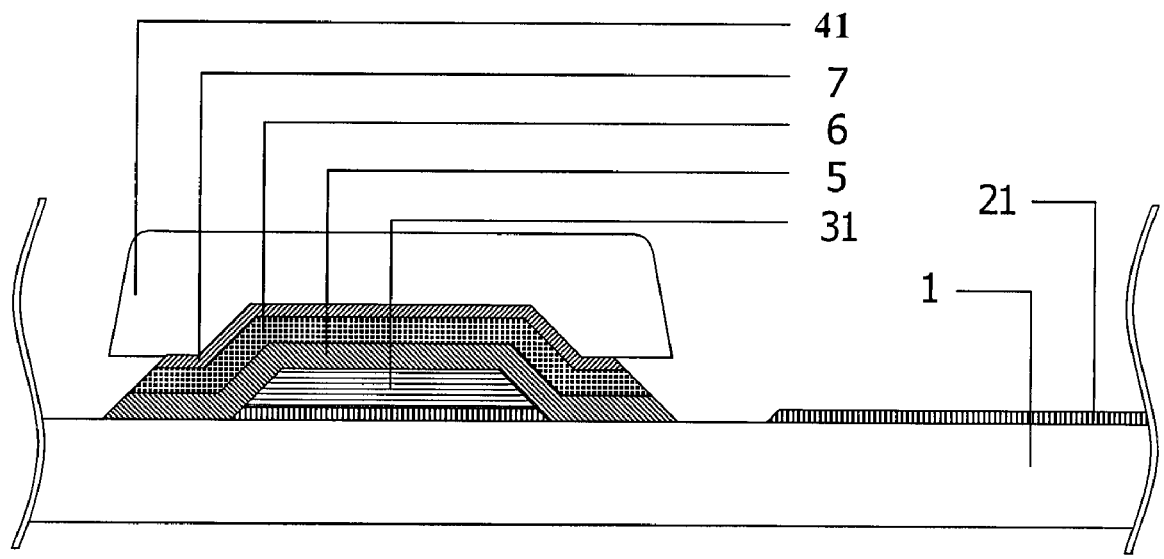
FIG. 7 is a cross-sectional view of the substrate after an etching process in the second step of the first embodiment.
Figure 8A:
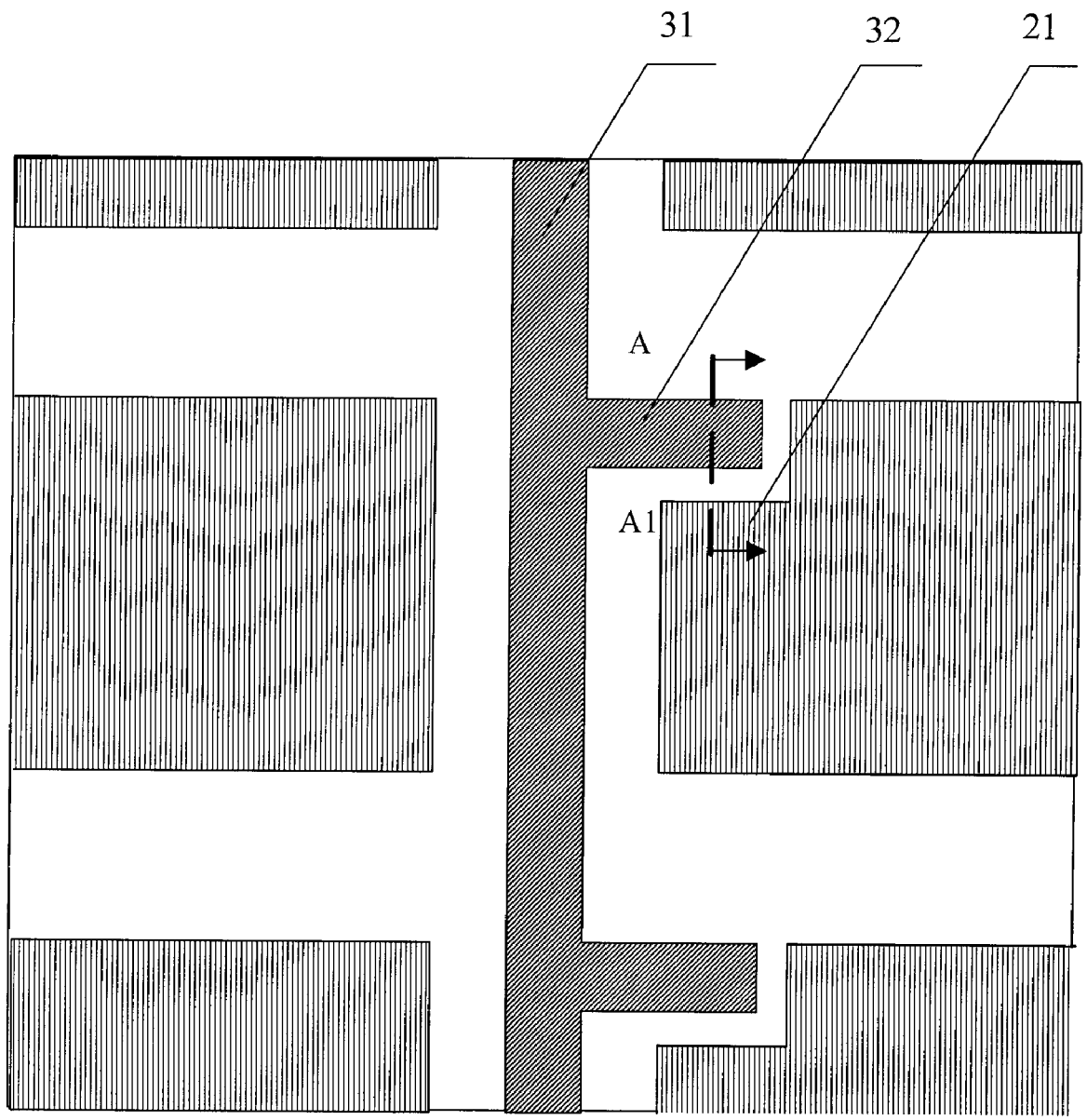
FIG. 8a is a planar view of the substrate after a lifting-off process in the second step of the first embodiment.
Figure 8B:
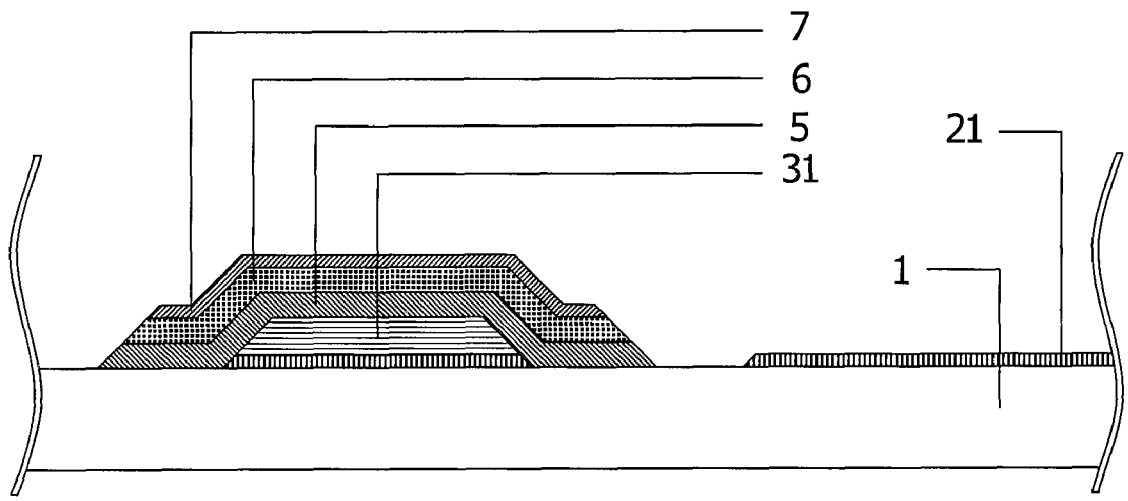

FIG. 7 is a cross-sectional view of the substrate after an etching process in the second step. As shown in FIG. 7, the heavily doped amorphous silicon layer 7, the amorphous layer 6, and the gate insulating layer 5 not covered by the photoresist pattern 41 is removed in the etching process. The gate line 31 and the gate electrode 32 are covered by the gate insulating layer 5, and the amorphous silicon layer 6 and the heavily doped amorphous silicon layer 7 are remained above the gate electrode 32. In addition, the gate insulating layer 3 on the pixel electrode 21 is removed, and thus the pixel electrode 21 formed from the transparent electrode layer is exposed. FIG. 8a is a planar sectional view after a lifting-off process in the second step, and FIG. 8b is a cross-sectional view taken along line A-A1 in FIG. 8a. As shown in FIGS. 8a and 8b, after the photoresist patter 41 is removed, a multilayer structure comprising the gate insulating layer 5, the amorphous silicon layer 6, and the heavily doped amorphous silicon layer 7 covers the gate line 31 and the gate electrode 32, and the pixel electrode 21 is exposed. Thus, the second step is completed here.

[Third Step]

Figure 9:
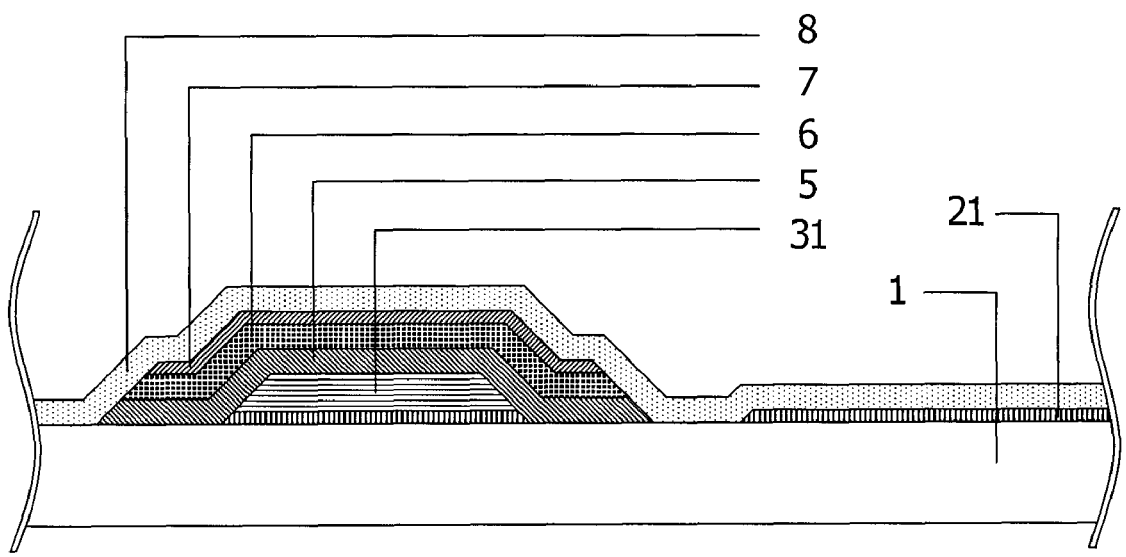
FIG. 9 is a cross-sectional view of the substrate after a deposition process in a third step of the first embodiment.
Figure 10:
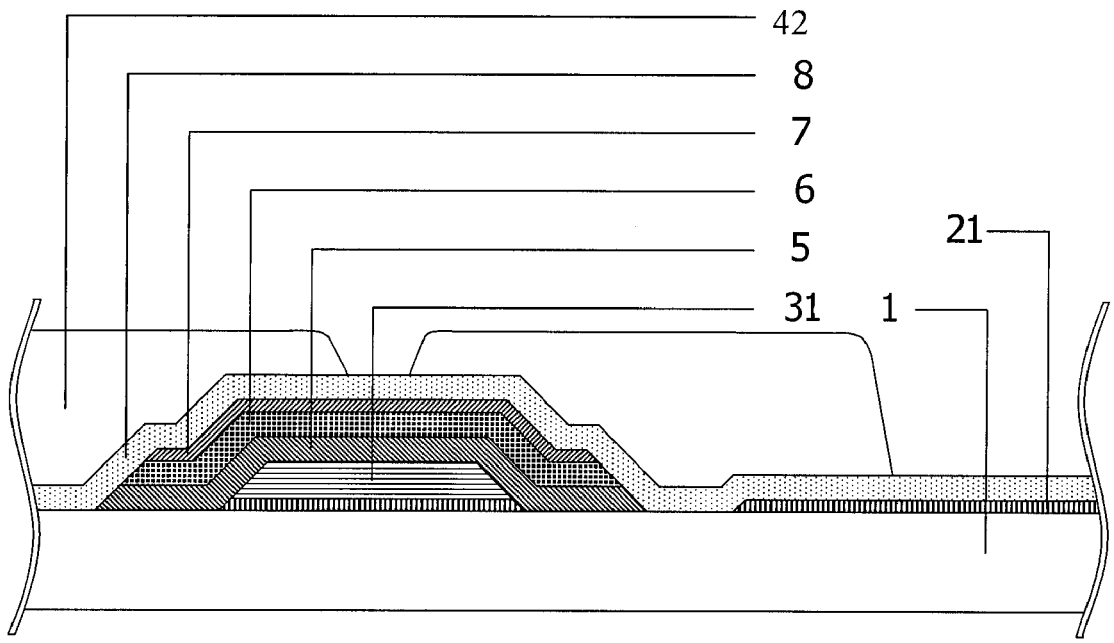
FIG. 10 is a cross-sectional view of the substrate after a masking process in the third step of the first embodiment.

FIG. 9 is a cross-sectional view of the substrate after a deposition process in a third step. As shown in FIG. 9, a data metal layer 8 is deposited on the surface of the substrate after the second step. FIG. 10 is a cross-sectional view of the substrate after a third masking process in the third step. Photoresist is applied on the surface of the substrate, and is patterned with a third mask plate so as to form a photoresist pattern 42. After lithography and etching with the photoresist pattern 42, a data line 81 and source/drain electrodes 82 are formed, and the rest part of the surface of the substrate is exposed, as shown in FIG. 11.

Figure 11:
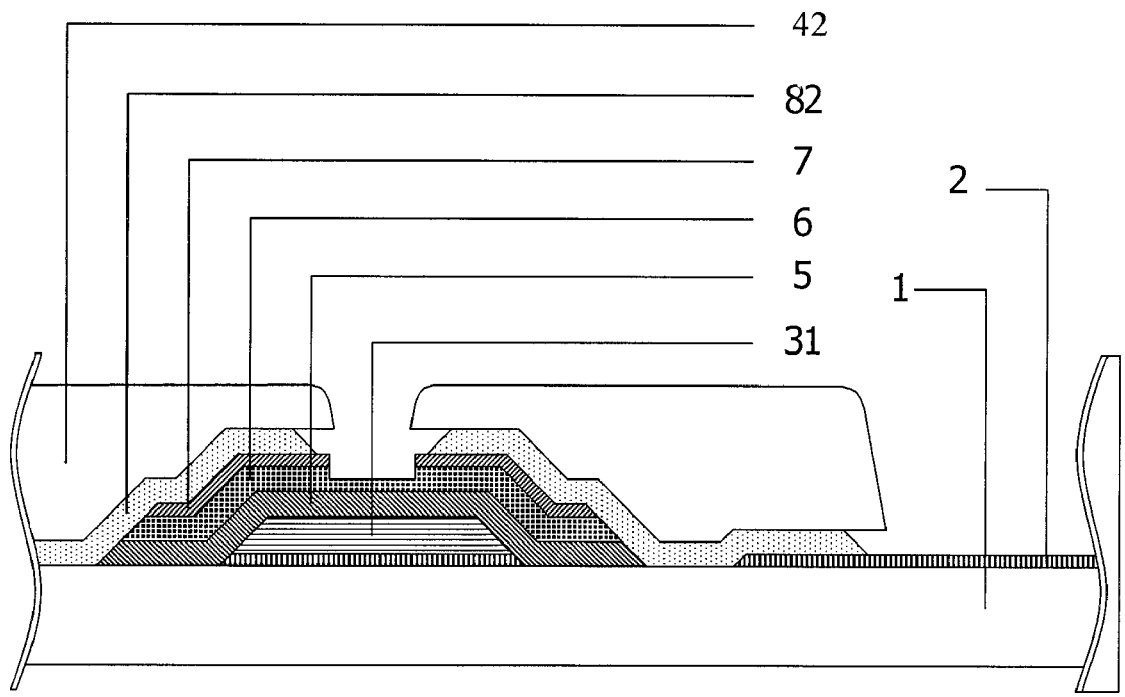
FIG. 11 is a cross-sectional view of the substrate after an etching process in the third step of the first embodiment.
Figure 12A:
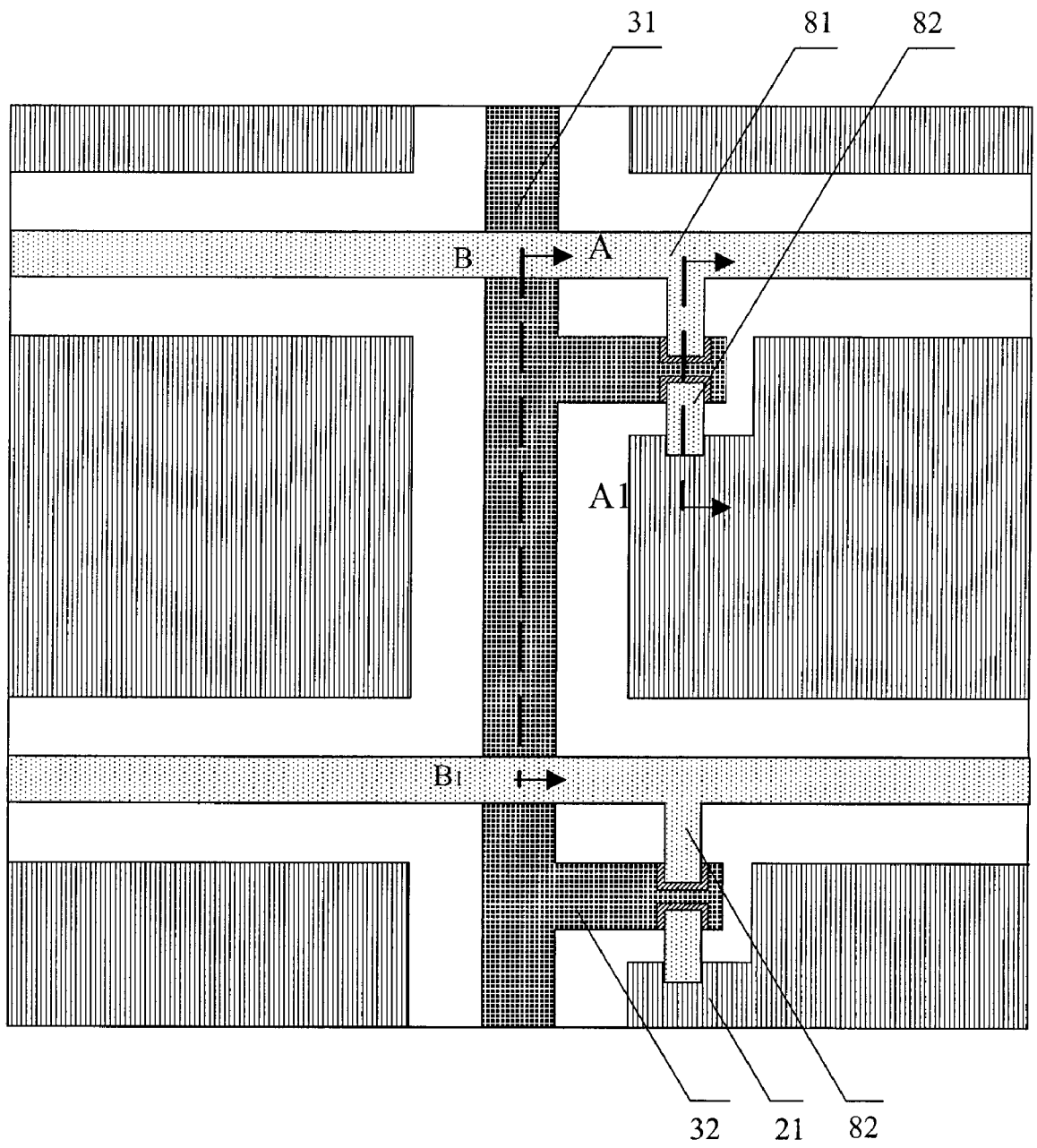
FIG. 12a is a planar view of the substrate after a lifting-off process in the third step of the first embodiment.
Figure 12B:
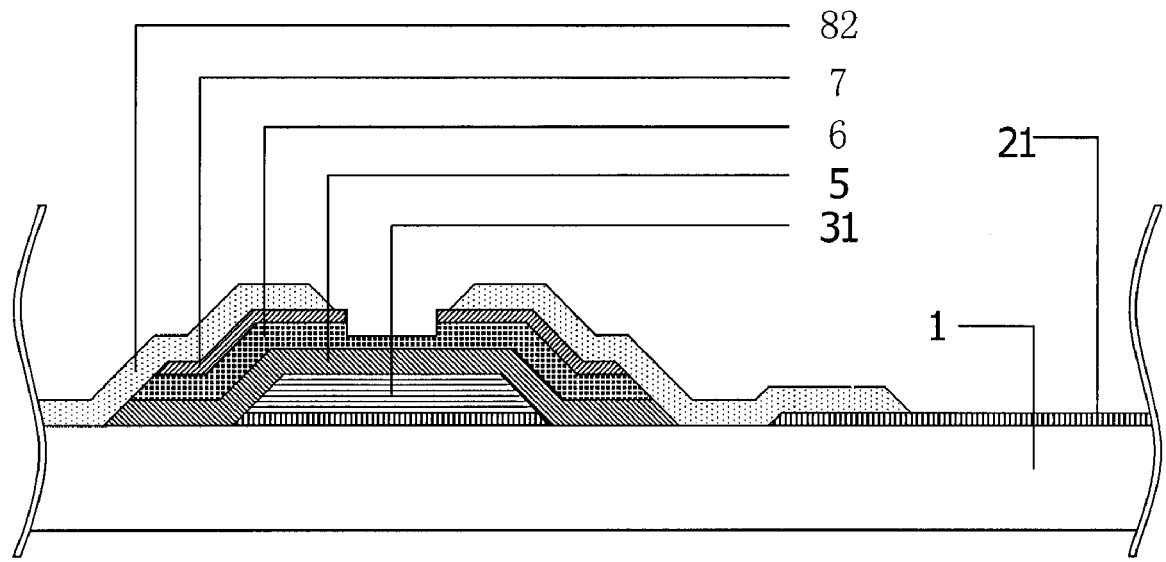

FIG. 11 is a cross-sectional view of the substrate after an etching process in the third step. As shown in FIG. 11, the data metal layer 8 not covered by the photoresist pattern 42 is removed in the etching process so as to form the source/drain electrodes 82 and the data line 81. At same time, the heavily doped amorphous silicon layer 7 and a part of amorphous silicon layer 6 located in an interval region between the source/drain electrodes 82 are removed, so that the amorphous silicon layer 6 is exposed in the interval region between the source/drain electrodes 82. FIG. 12a is a planar view of the substrate after a lifting-off process in the third step, and FIG. 12b is a cross-sectional view taken along line A-A1 in FIG. 12a. As shown in FIGS. 12a and 12b, after the photoresist pattern 42 is removed through the lifting-off process, the data line 81 and the source/drain electrodes 82 are obtained. In addition, the interval region is between the sour-drain electrodes 82, and the amorphous silicon layer 6 is exposed in the interval region. Thus, the third step is completed here.

The first embodiment provides a method in which the gate line, the gate electrode and the pixel electrode is formed in the first step; the multilayer structure is formed on the gate line and the gate electrode in the second step; and the data line and the source/drain electrodes are formed in the third step. According to the first embodiment, the number of masking processes can be reduced to three so as to effectively reduce the manufacturing steps. At the same time, with simplifying the manufacturing process, the first embodiment reduces the consumable material, such as photoresist, mask plate and the like, used in the manufacturing process, i.e., reduces the product cost of a LCD device. Also, the manufacturing equipment and the initial investment for producing are decreased, enhancing the investment return. In addition, the produce period can be decreased with the method of the first embodiment, and the product capability can be increased.

Second Embodiment

On the basis of the first embodiment, a second embodiment with a modified second step is provided. The specific description is as follows.

A gray tone mask plate is used in the modified second step. The gray tone mask plate comprises a non-transmissive region, a semi-transmissive region, and a transmissive region, wherein the non-transmissive region corresponds to the gate electrode 32, the semi-transmissive region corresponds to the gate line 31, and the transmissive region corresponds to the rest part of the surface of the substrate, i.e., the region except the gate line 31 and the gate electrode 32.

Figure 13:
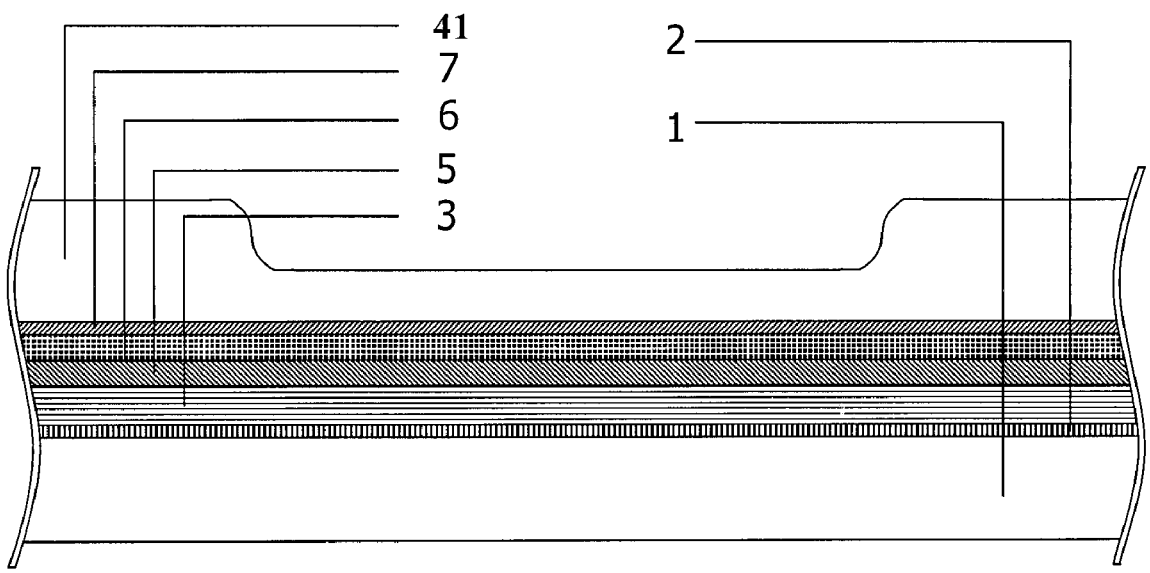
FIG. 13 is a cross-sectional view of a substrate after a masking process in a second embodiment.

FIG. 13 is a cross-sectional view of the substrate after a masking process in the modified second embodiment. After a photoresist is formed on the surface of the substrate 1, a lithography is performed with the gray tone mask plate to obtain a corresponding photoresist pattern 41 that is on the gate line 31 and the gate electrode 32 branched from the gate line 31. The thickness of the photoresist corresponding to the gate line 31 is less than that of the photoresist corresponding to the gate electrode 32, and the region except the gate line 31 and the gate electrode 32 is exposed, as shown in FIG. 13. The photoresist patter 41 is used for an etching process, and the multilayer structure is etched. After the etching process, an ashing process is performed on the photoresist pattern 41, so that the thickness of the photoresist pattern 41 is decreased, and the photoresist corresponding to the gate line 31 is removed.

Figure 14:
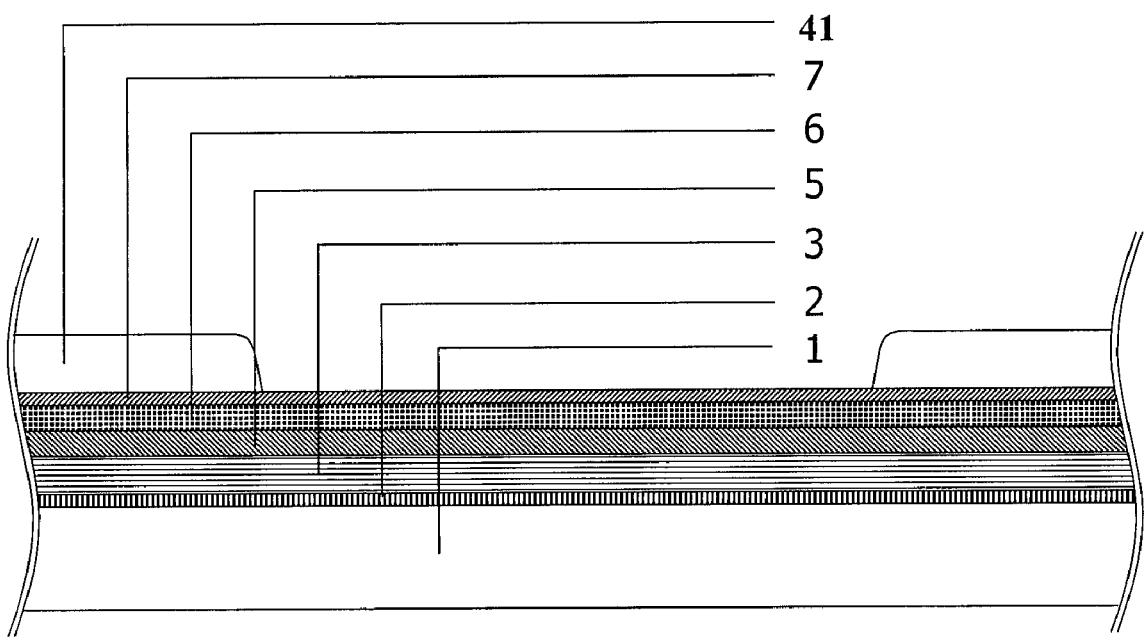
FIG. 14 is a cross-sectional view of the substrate after an ashing process in the second embodiment.

FIG. 14 is a cross-sectional view of the substrate after the ashing process in the second embodiment. The substrate is further etched by using the remained photoresist pattern 41. After removal of the exposed heavily doped amorphous silicon layer 7, amorphous silicon layer 6, and gate insulating layer 5, a certain thickness of photoresist is removed by the ashing process; the photoresist 4 is remained only on the gate electrode 32, and the multilayer structure is exposed on the gate line 31, as shown in FIG. 14. Subsequently, a second etching is performed.

Figure 15:
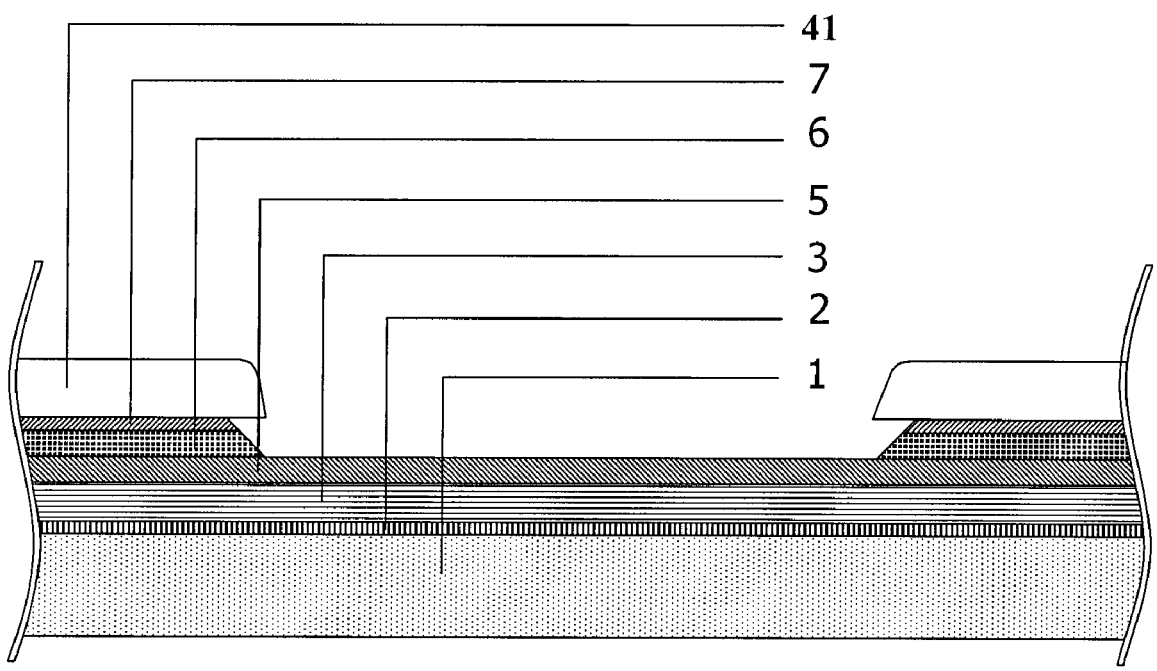
FIG. 15 is a cross-sectional view of the substrate after an etching process in the second embodiment.
Figure 16A:
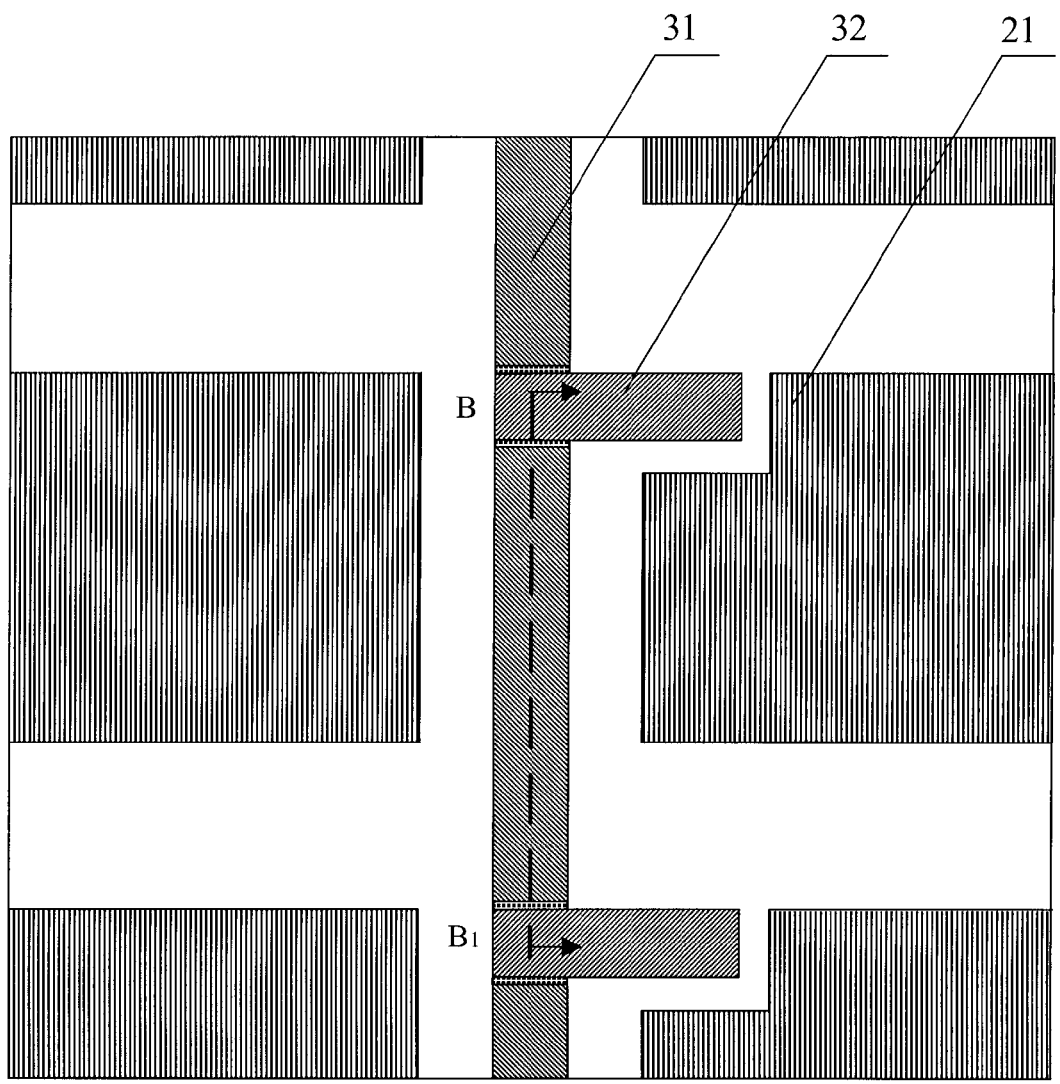
FIG. 16a is a planar view of the substrate after a lifting-off process in the second embodiment.
Figure 16B:
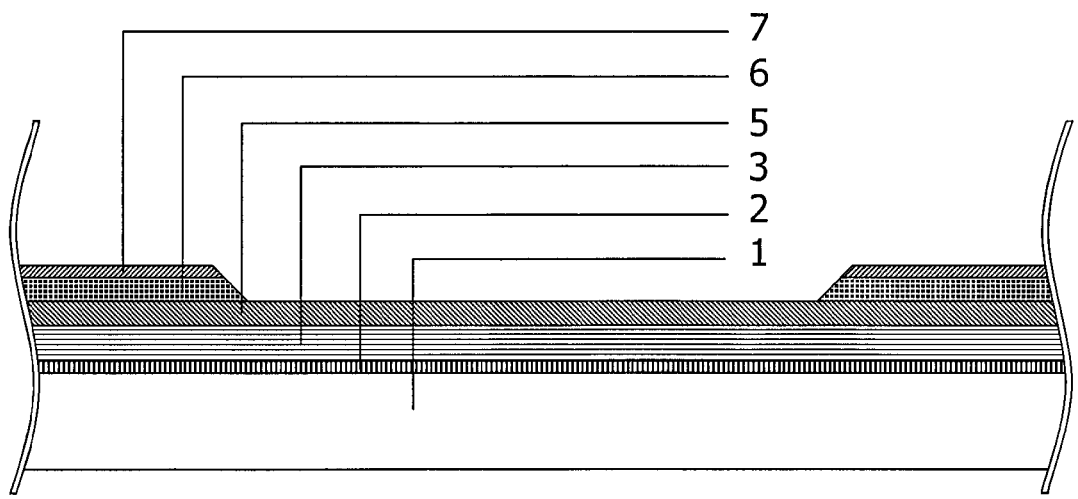
Figure 17:
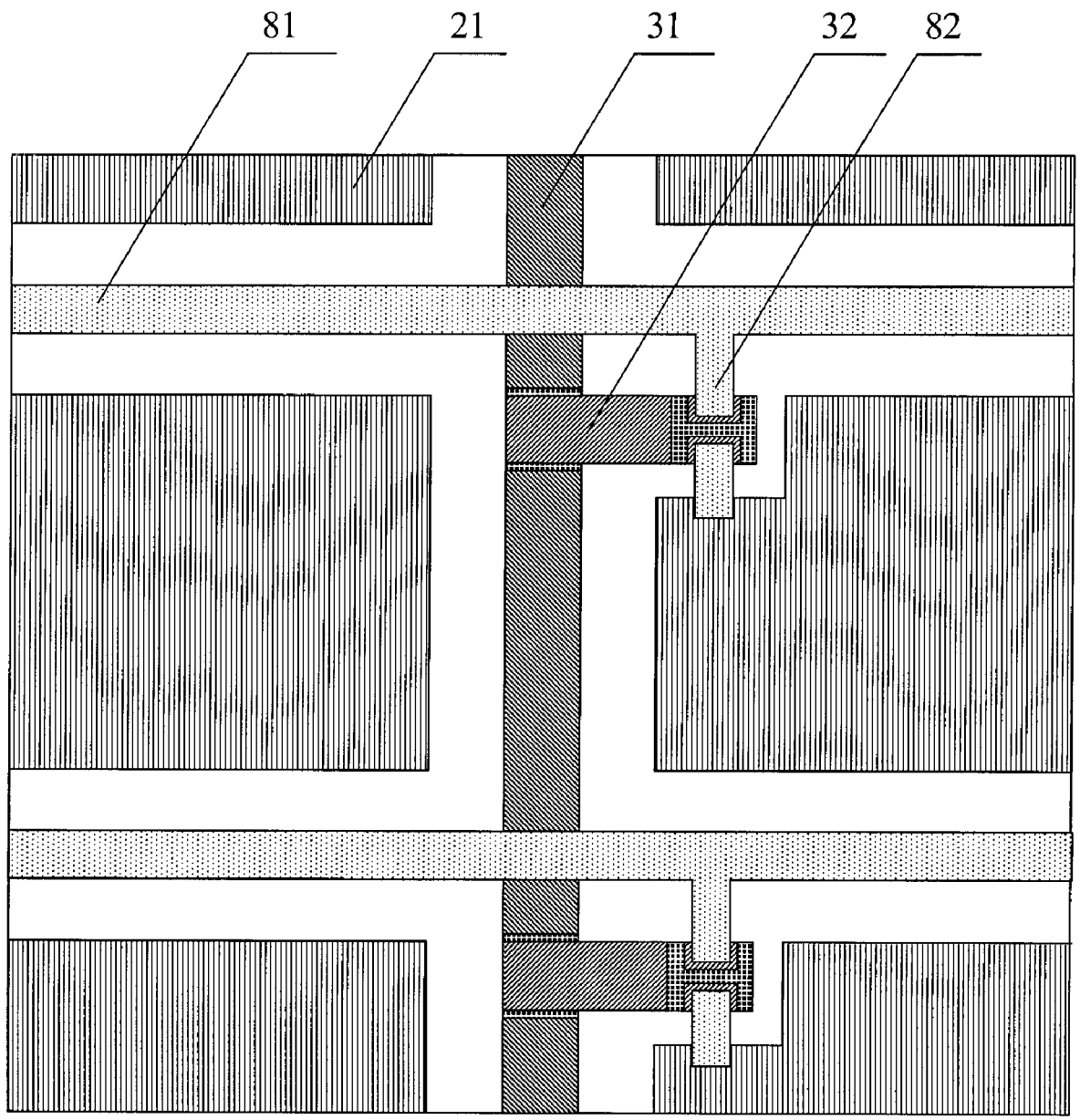
FIG. 17 is a planar view of the substrate manufactured in the second embodiment.

FIG. 15 is a cross-sectional view of the substrate after the second etching process in the second step of the second embodiment. As shown in FIG. 15, the heavily doped silicon layer 7 and the amorphous silicon layer 6 on the gate line 31 not covered by the photoresist is removed by the second etching process, and the gate insulating layer 5 is exposed on the gate line 31. FIG. 16a is a planar view of the substrate after a lifting-off process in the second embodiment, and FIG. 16b is a cross-sectional view taken along line B-B1 in FIG. 16a. As shown in FIGS. 16a and 16b, after the remaining photoresist on the gate electrode 32 is removed by the lifting-off process, the gate insulating layer 5, the amorphous silicon layer 6 and the heavily doped silicon layer 7 are remained on the gate electrode 32, and only the gate insulating layer is remained on the gate line 31. FIG. 17 is a planar view of the substrate manufactured in the second step according to the second embodiment. As shown in FIG. 17, the surface of the gate line 31 is only covered with the gate insulating layer 5, and therefore the two adjacent data lines 81 are insulated from each other.

Figure 12C:
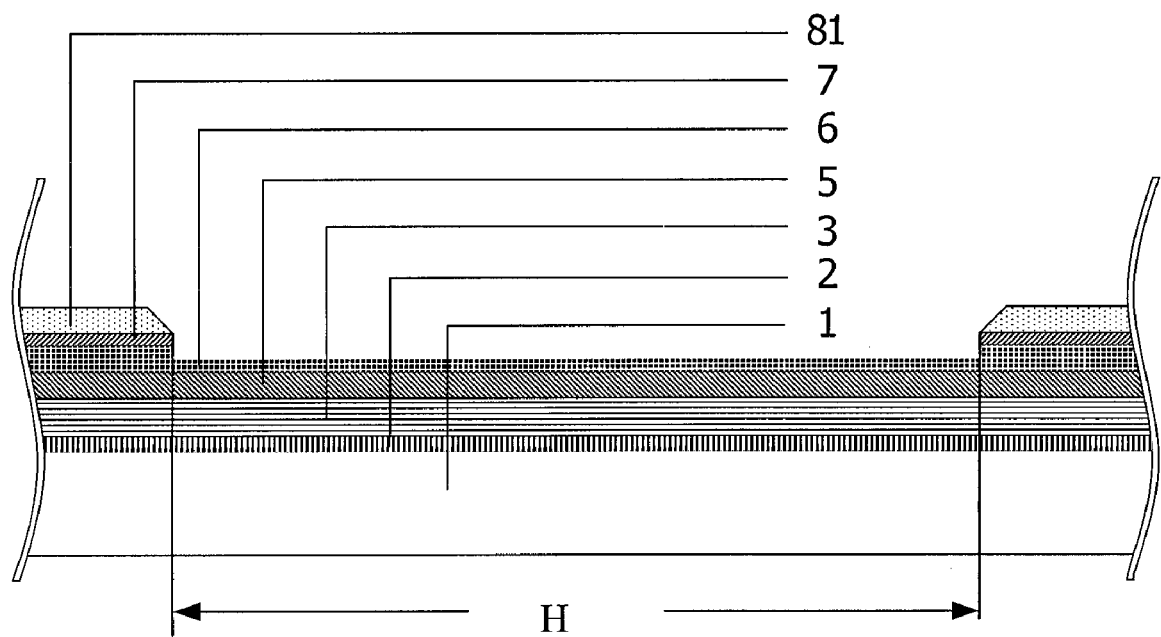

FIG. 12c is a cross-sectional view taken along line B-B1 in FIG. 12a. As shown in FIGS. 12a and 12c, a part of amorphous silicon layer 6 is remained at an H-shaped portion between two adjacent data lines 81, and therefore a minor current may exist between the two adjacent data lines 81, and the display quality of the LCD device may be affected.

Through the method according to the second embodiment, the amorphous silicon layer 6 at the H-shaped portion can be removed completely, so that the adjacent data lines 81 are insulated from each other. Thus, the display quality of the LCD device can be further improved.

Third Embodiment

On the basis of the first embodiment, a third embodiment with a modified third step is provided. The specific description is as follows.

Figure 18:
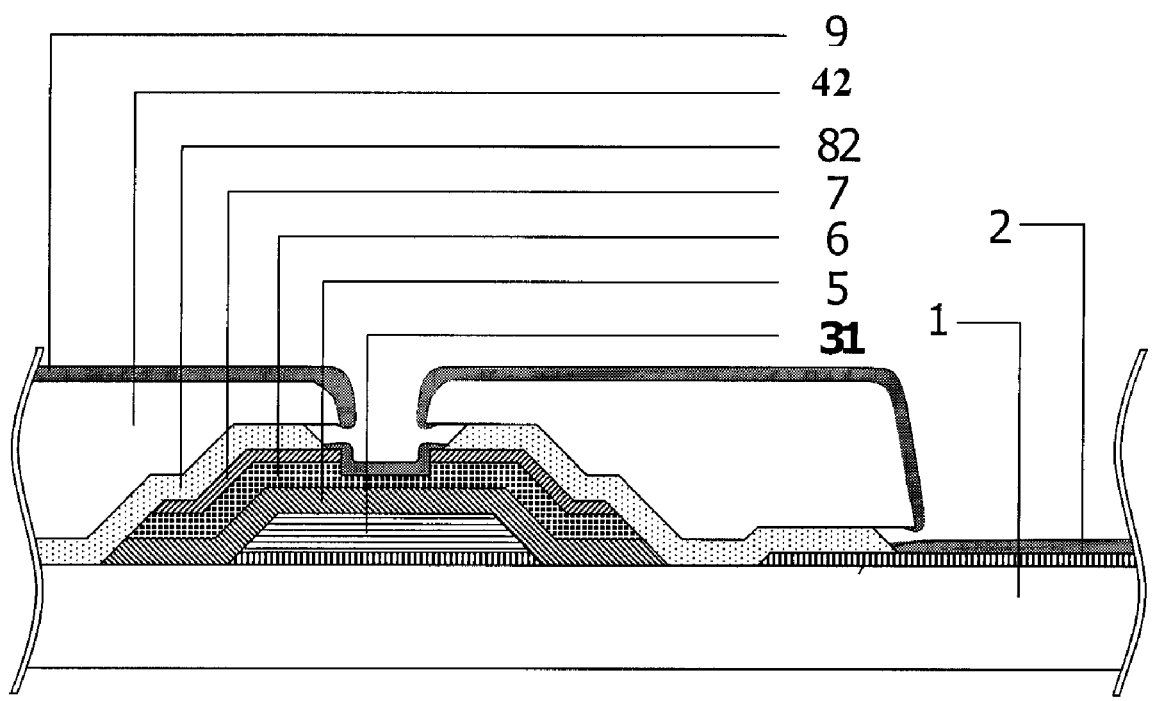
FIG. 18 is a cross-sectional view of the substrate after a deposition view in a third embodiment.
Figure 19A:
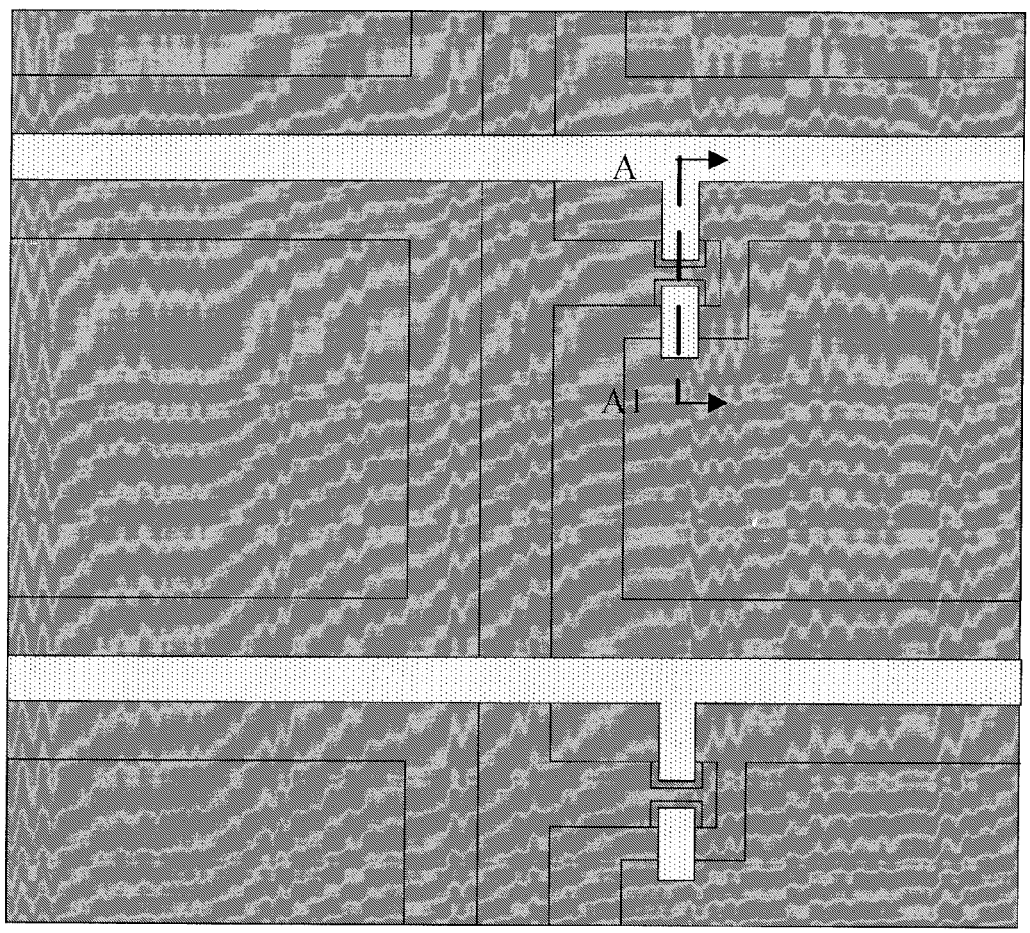
FIG. 19a is a planar view of the substrate after a lifting-off process in the third embodiment.
Figure 19B:
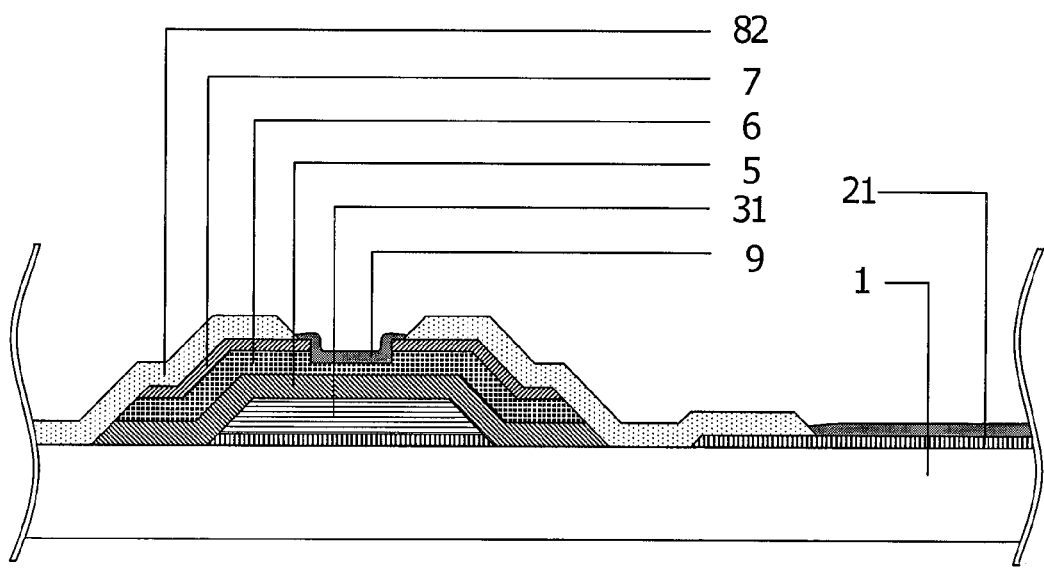

FIG. 18 is a cross-sectional view of the substrate after a deposition process in the modified third step in the third embodiment. As shown in FIG. 18, after the data metal layer 8 is etched in the modified third step, a passive layer 9 is deposited on the surface of the resultant substrate. FIG. 19a is a planar view of the substrate after a lifting-off process in the third embodiment, and FIG. 19b is a cross-sectional view taken along A-A1 of FIG. 19a. As shown in FIG. 19a and 19b, the photoresist pattern 42 and the passive layer 9 on the photoresist pattern 42 are removed together by the lifting-off process, so that the passive layer 9 covers the interval region between the source/drain electrodes 82, and at the same time, the passive layer 9 covers the region except the data line 81 and the source/drain electrodes 82. Thus, the modified third step is completed here.

If the interval region between the source/drain electrodes is exposed, some conduct particles such as dust and the like may be attached thereto, and then the TFT may not function properly.

Through the method in the third embodiment, the passive layer is formed in the interval region between the source/drain electrodes to prevent the interval region from being contaminated by conductive particles. At the same time, the passive layer can also be used to prevent the elements in the rest region from being damaged. Therefore, the quality of the LCD device can be enhanced effectively.

Fourth Embodiment

On the basis of the first embodiment, a further modified third step is provided in a fourth embodiment. The specific description is as follows.

Figure 20A:
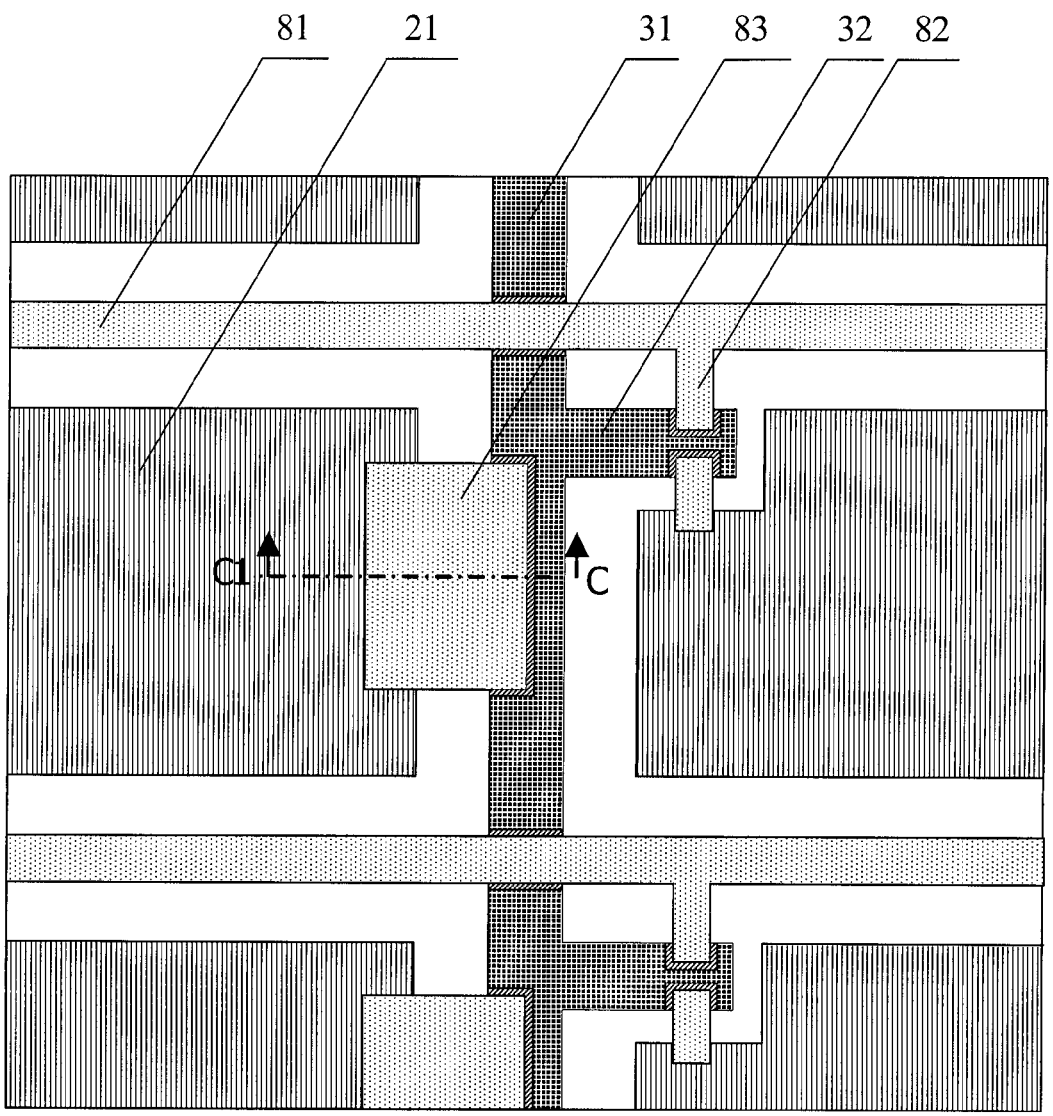
FIG. 20a is a planar view of the substrate formed with a gate capacitance electrode.
Figure 20B:
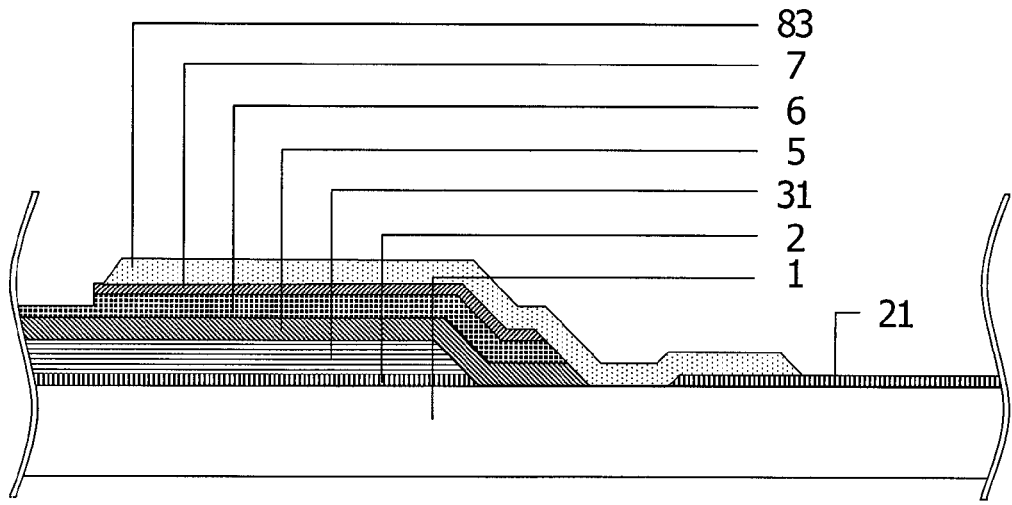

FIG. 20a is a planar view of the substrate disposed with a gate capacitance electrode, and FIG. 20b is a cross-sectional view taken along line C-C1 in FIG. 20a. As shown in FIGS. 20a and 20b, the gate capacitance electrode 83 is a part of the data metal layer 8 and isolated from the data line 81 and the source/drain electrodes 82. One end of the gate capacitance electrode 83 is electrically connected with the pixel electrode 21, and the other end is overlapped on the gate line 31.

In the further modified third step, when the etching is performed with a modified third mask plate, a corresponding photoresist pattern is formed on the data lines and the source/drain electrodes 82, and at the same time, a corresponding photoresist pattern is formed on the gate capacitance electrode. The gate capacitance electrode 83 is formed in the subsequent etching processes as described in the first embodiment.

Fifth Embodiment

A fifth embodiment according to the invention is provided with improvements on the basis of the first embodiment. The specific description is as follows.

Figure 21:
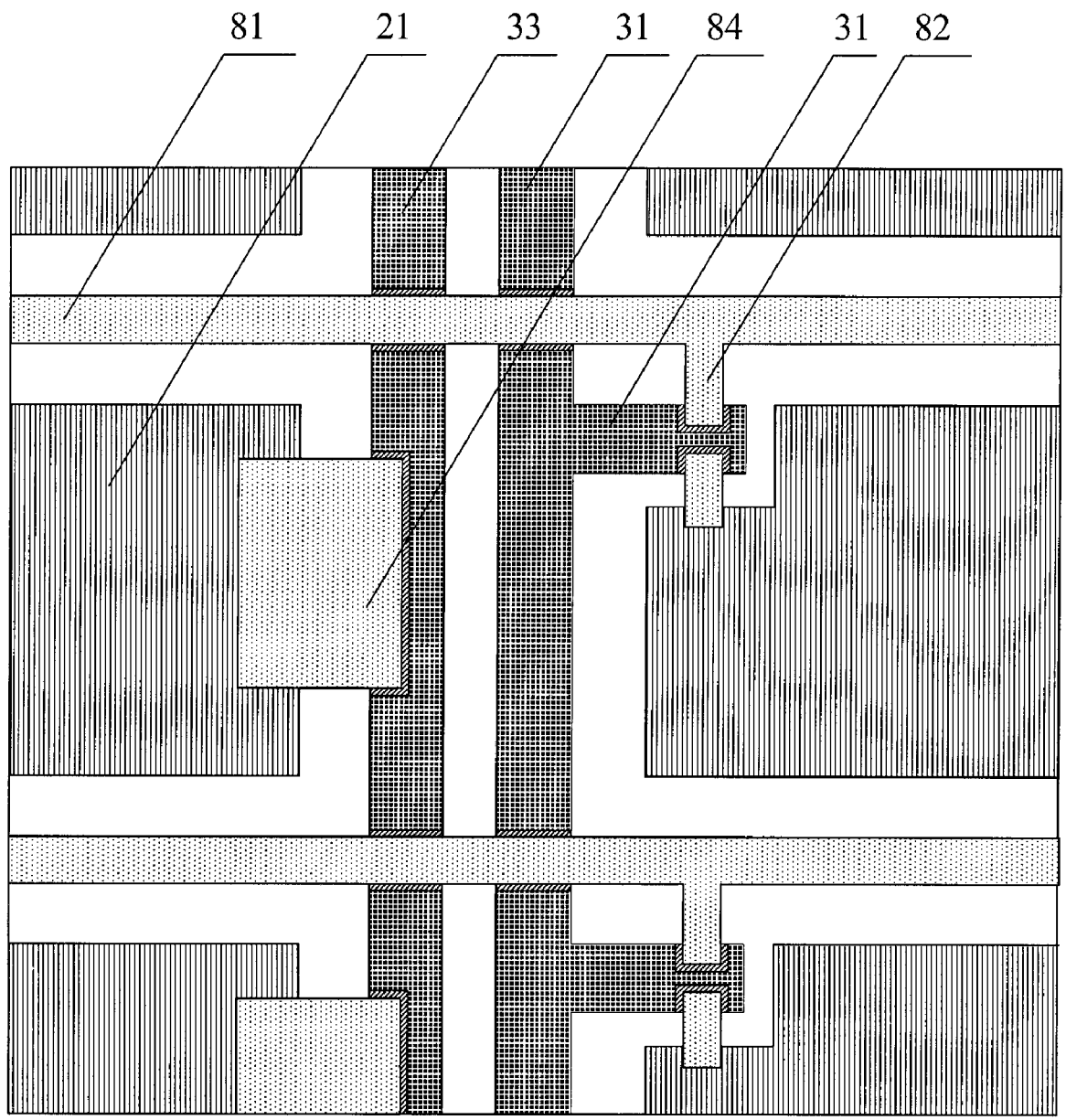
FIG. 21 is a planar view of the substrate disposed with a common capacity layer.

FIG. 21 is a planar view of the substrate disposed with a common capacitance electrode 84. As shown in FIG. 21, a common electrode line 33 is disposed near the gate line 31, and the common capacitance electrode 84 is disposed between the common electrode line 33 and the pixel electrode 21. One end of the common capacitance electrode 84 is electrically connected with the pixel electrode 21, and the other end is disposed on the common electrode line 33.

In the first step as described in the first embodiment, except forming the pixel electrode 21, the gate line 31, and the gate electrode 32, the common electrode line 33 is formed at the same time, and the formed common electrode line 33 is parallel with the gate line 31. In the second step as described in the first embodiment, the formed gate insulating layer 3 covers the common electrode line 33. In the third step as described in the first embodiment, except forming the data line 81 and the source/drain electrodes 82, the common capacitance electrode 84 is also formed at the same time. One end of the formed common capacitance electrode is electrically connected with the pixel electrode 21, and the other end is disposed on the common electrode line 33, and the common capacitance electrode 84 is not electrically connected with the data line 81 and the source/drain electrodes 82.

In the first to fifth embodiment, the doped amorphous silicon layer 7 is preferably a heavily doped N type amorphous silicon layer; the metal layer is a single layer structure formed of AlNd, Al, Cu, Mo, MoW or Cr, or a multilayer structure formed of any combination of AlNd, Al, Cu, Mo, MoW and Cr; the data metal layer is a single layer structure formed of AlNd, Al, Cu, Mo, MoW or Cr, or a multilayer structure formed of any combination of AlNd, Al, Cu, Mo, MoW and Cr; the gate insulating layer is a single layer structure formed of SiNx, SiOx or SiOxNy, or a multilayer structure formed of any combination of SiNx, SiOx and SiOxNy.

In the third embodiment, the passive layer is a single layer structure formed of SiNx, SiOx or SiOxNy, or a multilayer structure formed of any combination of SiNx, SiOx and SiOxNy.

Further, the above methods in the first to fifth embodiments can be combined arbitrarily. Moreover, the first to the fifth embodiment can be combined together according to the specific requirement, so as to form an array substrate of a LCD device, which can prevent the minor current between the adjacent data lines, prevent the interval region between the source/drain electrodes from being contaminated, or have the gate capacitance electrode and the common capacitance electrode.

The embodiment of the invention discloses an exemplary method, in which a gate line, a gate electrode, and a pixel electrode are formed in a first step; a multilayer structure is formed on the gate line and the gate electrode in a second step; and a data line and source/drain electrodes are formed in a third step. The number of masking processes can be reduced to three in the method, reducing the steps effectively. Through simplifying the manufacturing process, the implementation of the invention can reduce the consumable material used in the manufacturing process, such as photoresist, mask plate and the like, so as to decrease cost of manufacturing a LCD device, and also the manufacturing equipment and the investment can be reduced, and the investment return can enhanced. In addition, the product period can be decreased according to the method disclosed in the embodiments, and the product capacity can be enhanced at the same time.

The embodiments of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A method of manufacturing an array substrate of a liquid crystal display (LCD) device, comprising the steps of:
    step 1, in which a transparent electrode layer and a gate metal layer are sequentially deposited on a surface of a substrate and are patterned with a first mask plate, so as to form a pixel electrode from the transparent electrode layer and a gate line and a gate electrode branched from the gate line from the gate metal layer;
    step 2, in which a gate insulating layer, a semiconductor layer, and a heavily doped semiconductor layer are deposited sequentially on the substrate after step 1 and are patterned with a second mask plate, and the gate insulating layer covers the gate line and the gate electrode, the semiconductor layer and the heavily doped semiconductor layer are remained above the gate electrode, and the gate metal layer is removed on the pixel electrode to expose the pixel electrode;
    step 3, in which a data metal layer is deposited on the substrate after step 2 and is patterned with a photoresist pattern formed by a third mask plate, so as to form a source electrode, a drain electrode and a data line, and the semiconductor layer is exposed in an interval region between the source and drain electrodes;
    step 4, in which a passive layer is deposited on the photoresist pattern and on a portion of the semiconductor layer exposed by the photoresist pattern in the interval region between the source and drain electrodes; and
    step 5, in which the passive layer is removed directly over the source electrode, the drain electrode and the data line using a lifting-off process of the photoresist pattern.

2. The method of claim 1, wherein the second mask plate is a gray tone mask plate comprising a non-transmissive region, a semi-transmissive region, and a transmissive region; and
    wherein the non-transmissive region corresponds to the gate electrode, the semi-transmissive region corresponds to the gate line, and the transmissive region corresponding to the rest region of the substrate,
    the heavily doped semiconductor layer, the semiconductor layer, and the gate metal layer corresponding to the transmissive region are removed by a first etching, and
    the heavily doped semiconductor layer and the semiconductor layer corresponding to the semi-transmissive region are removed by a second etching.

3. The method of claim 1, wherein, in step 3, a capacitance electrode is formed from the data metal layer, the capacitance electrode is isolated from the data line and the source and drain electrodes, one end of the capacitance electrode is connected with the pixel electrode, and the other is overlapped on the gate line.

4. The method of claim 1, wherein, in step 1, a common electrode line having the same structure of the gate line is formed and is parallel with the gate line;
    in step 2, the common electrode line is covered at least with the gate insulating layer; and
    in step 3, a capacitance electrode is formed from the data metal layer, the capacitance electrode is isolated from the data line and the source and drain electrodes, one end of the capacitance electrode is electrically connected with the pixel electrode, and the other is overlapped on the common electrode line.

5. The method of claim 2, wherein, in step 3, after patterning with the third mask plate so as to form the source and drain electrodes and the data line, a passive layer is deposited and is removed above the source and drain electrodes and the data line.

6. The method of claim 5, wherein, in step 3, a capacitance electrode is formed from the data metal layer, the capacitance electrode is isolated from the data line and the source and drain electrodes, one end of the capacitance electrode is connected with the pixel electrode, and the other is overlapped on the gate line.

7. A method of claim 5, wherein, in step 1, a common electrode line having the same structure of the gate line is formed and is parallel with the gate line;
    in step 2, the common electrode line is covered at least with the gate insulating layer; and
    in step 3, a capacitance electrode is formed from the data metal layer, the capacitance electrode is isolated from the data line and the source and drain electrodes, one end of the capacitance electrode is electrically connected with the pixel electrode, and the other is overlapped on the common electrode line.

8. The method of claim 1, wherein the gate metal layer or the data metal layer comprises a single layer structure formed of a material selected from the group consisting of AlNd, Al, Cu, MoW, and Cr, or a multilayer structure of any combination of AlNd, Al, Cu, Mo, MoW and Cr.

9. The method of claim 1, wherein the gate insulating layer comprises a single layer structure formed of a material selected from the group consisting of $SiN_x$, $SiO_x$ and $SiO_xN_y$, or a multilayer structure formed of any combination of $SiN_x$, $SiO_x$ and $SiO_xN_y$.

10. The method of claim 1, wherein, in the passive layer comprises a single layer structure formed of a material selected from the group consisting of $SiN_x$, $SiO_x$ and $SiO_xN_y$, or a multilayer structure formed of any combination of $SiN_x$, $SiO_x$ and $SiO_xN_y$.

11. The method of claim 5, wherein, in the passive layer comprises a single layer structure formed of a material selected from the group consisting of $SiN_x$, $SiO_x$ and $SiO_xN_y$, or a multilayer structure formed of any combination of $SiN_x$, $SiO_x$ and $SiO_xN_y$.

12. The method of claim 2, wherein, in step 3, a capacitance electrode is formed from the data metal layer, the capacitance electrode is isolated from the data line and the source and drain electrodes, one end of the capacitance electrode is connected with the pixel electrode, and the other is overlapped on the gate line.

13. The method of claim 1, wherein, in step 1, a common electrode line having the same structure of the gate line is formed and is parallel with the gate line;
    in step 2, the common electrode line is covered at least with the gate insulating layer; and
    in step 3, a capacitance electrode is formed from the data metal layer, the capacitance electrode is isolated from the data line and the source and drain electrodes, one end of the capacitance electrode is electrically connected with the pixel electrode, and the other is overlapped on the common electrode line.

14. A method of manufacturing an array substrate of a liquid crystal display (LCD) device, the method comprising:
    sequentially deposited a transparent electrode layer and a gate metal layer on a surface of a substrate and patterning the transparent electrode and gate metal layers with a first mask plate, so as to form a pixel electrode from the transparent electrode layer and a gate line and a gate electrode branched from the gate line from the gate metal layer;
    sequentially depositing a gate insulating layer, a semiconductor layer, and a heavily doped semiconductor layer on the substrate and patterning the gate insulating, semiconductor and heavily doped semiconductor layers with a second mask plate, the gate insulating layer covering the gate line and the gate electrode, the semiconductor layer and the heavily doped semiconductor layer remaining above the gate electrode, and the gate metal layer being removed from the pixel electrode to expose the pixel electrode; and
    depositing a data metal layer on the substrate and patterning the data metal layer with a third mask plate so as to form source and drain electrodes and a data line, the semiconductor layer being exposed in an interval region between the source and drain electrodes.

15. The method of claim 14, further comprising:
    depositing a passive layer on a photoresist pattern and on a portion of the semiconductor layer exposed by the photoresist pattern in the interval region between the source and the drain electrodes such that the photoresist pattern is positioned between the passive layer and the source and drain electrodes.

16. The method of claim 15, further comprising:
    implementing a lifting-off process to remove portions of the photoresist pattern in contact with the source and drain electrodes, respectively, while retaining a portion of the passive layer on said exposed portion of the semiconductor layer.

* * * * *